(12) United States Patent
Kawamura et al.

(10) Patent No.: US 11,332,409 B2
(45) Date of Patent: May 17, 2022

(54) OPTICAL APPARATUS AND EQUIPMENT

(71) Applicant: CANON KABUSHIKI KAISHA, Tokyo (JP)

(72) Inventors: Yoshihisa Kawamura, Yokohama (JP); Hideki Ina, Tokyo (JP); Ryo Yoshida, Kawasaki (JP); Yukinobu Suzuki, Koza-gun (JP); Koji Hara, Ichikawa (JP); Yoshiyuki Nakagawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 238 days.

(21) Appl. No.: 16/694,383

(22) Filed: Nov. 25, 2019

(65) Prior Publication Data

US 2020/0172443 A1 Jun. 4, 2020

(30) Foreign Application Priority Data

Nov. 30, 2018 (JP) .............................. JP2018-225866

(51) Int. Cl.
*H01L 27/146* (2006.01)
*C04B 35/584* (2006.01)

(52) U.S. Cl.
CPC ...... *C04B 35/584* (2013.01); *H01L 27/14612* (2013.01); *H01L 27/14627* (2013.01); *H01L 27/14643* (2013.01)

(58) Field of Classification Search
CPC .............................................. H01L 27/14627
See application file for complete search history.

(56) References Cited

U.S. PATENT DOCUMENTS

| 6,614,479 | B1* | 9/2003 | Fukusho | H01L 27/1462 |
| | | | | 250/216 |
| 2006/0258041 | A1 | 11/2006 | Aita | |
| 2008/0048280 | A1 | 2/2008 | Tsukamoto | |
| 2009/0002531 | A1 | 1/2009 | Godaiin | |
| 2009/0147101 | A1* | 6/2009 | Tatani | H01L 27/14621 |
| | | | | 348/224.1 |
| 2009/0256225 | A1 | 10/2009 | Nakai | |
| 2015/0263212 | A1* | 9/2015 | Uya | H01L 27/14689 |
| | | | | 257/463 |
| 2017/0077165 | A1* | 3/2017 | Kimura | H01L 27/1463 |
| 2017/0090075 | A1* | 3/2017 | Iwata | G02B 3/0075 |
| 2017/0278889 | A1* | 9/2017 | Nakashikiryo | H01L 27/14627 |

FOREIGN PATENT DOCUMENTS

| JP | 2005-174967 A | 6/2005 |
| JP | 2008-60320 A | 3/2008 |
| JP | 2008-71959 A | 3/2008 |
| JP | 2008-91771 A | 4/2008 |
| JP | 2008-108918 A | 5/2008 |
| JP | 2008-112944 A | 5/2008 |

* cited by examiner

*Primary Examiner* — Thanh Luu
(74) *Attorney, Agent, or Firm* — Canon U.S.A., Inc., IP Division

(57) ABSTRACT

A curved surface constituting a convex surface or a concave surface of each of a plurality of lenses includes at least a silicon nitride layer and another silicon nitride layer. An interlayer having a composition different from a composition of the silicon nitride layer and a composition of the other silicon nitride layer is arranged between the silicon nitride layer and the other silicon nitride layer, and a thickness of the interlayer is less than a thickness of the silicon nitride layer and a thickness of the other silicon nitride layer.

20 Claims, 7 Drawing Sheets

OPTICAL APPARATUS AND EQUIPMENT

BACKGROUND OF THE INVENTION

Field of the Invention

The present technique relates to an optical apparatus including a lens.

Description of the Related Art

An optical apparatus such as a complementary metal-oxide semiconductor (CMOS) image sensor uses an on-chip lens array to collect light. The on-chip lens array can include silicon compound layers. Japanese Patent Application Laid-Open No. 2005-174967 discusses an intra-layer lens having a structure in which a silicon nitride layer and a silicon oxide layer are laminated alternately.

With the technique discussed in Japanese Patent Application Laid-Open No. 2005-174967, sufficient optical characteristics cannot be acquired due to loss of light or worsening of aberration arising in the silicon nitride layer and the silicon oxide layer.

SUMMARY OF THE INVENTION

Therefore, the present technique is directed to an optical apparatus including a lens array with improved optical characteristics. According to an aspect of the present disclosure, an optical apparatus includes a base member and a plurality of lenses arrayed on the base member, wherein a curved surface constituting a convex surface or a concave surface of each of the plurality of the lenses is formed by at least a first layer containing silicon and nitrogen and a second layer containing silicon and nitrogen, wherein a third layer having a composition different from a composition of the first layer and a composition of the second layer is arranged between the first layer and the second layer, and wherein a thickness of the third layer is less than a thickness of the first layer and a thickness of the second layer.

Further features of the present disclosure will become apparent from the following description of exemplary embodiments (with reference to the attached drawings).

DESCRIPTION OF THE EMBODIMENTS

Figure 1A:
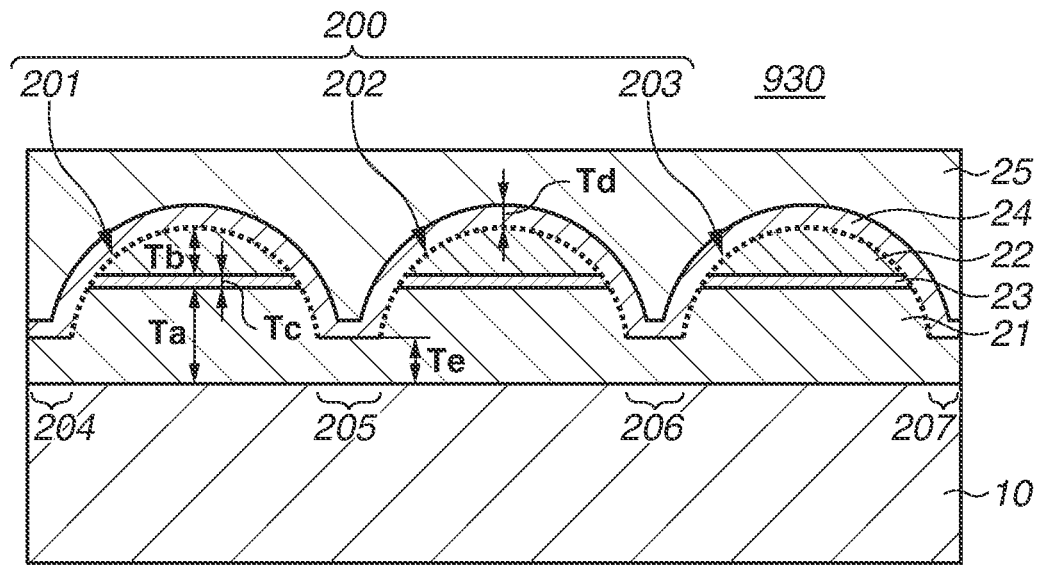
FIGS. 1A and 1B are schematic diagrams illustrating an optical apparatus.

Hereinafter, an exemplary embodiment embodying the present technique will be described with reference to the appended drawings. In the below-described exemplary embodiments and drawings, common reference numerals are applied to configurations common in the plurality of drawings. Therefore, the common configuration will be described with cross-reference to the plurality of drawings, and description of the configurations having the common reference numerals will be omitted as appropriate.

FIG. 1A is a cross-sectional schematic diagram illustrating an example of an optical apparatus 930. The optical apparatus 930 includes a base member 10 and a lens array 200. The lens array 200 includes a plurality of lenses 201, 202, and 203 arrayed on the base member 10. Each of the lenses 201, 202, and 203 includes a curved surface (hereinafter, called as "lens curved surface") that constitute a convex surface or a concave surface serving as a lens refracting surface. In FIG. 1A, the lens curved surfaces of the respective lenses 201, 202, and 203 are expressed by dotted lines indicated by arrows. In the present exemplary embodiment, each of the lenses 201, 202, and 203 is a plane-convex lens having an upper convex portion. Therefore, the lens curved surface of each of the lenses 201, 202, and 203 is a convex surface on a side opposite to a side of the base member 10. The lens curved surface is formed by silicon nitride layers 21 and 22 containing at least silicon (Si) and nitrogen (N). An interlayer 23 having a composition different from compositions of the silicon nitride layers 21 and 22 is arranged between the silicon nitride layers 21 and 22. The silicon nitride layer 21 is positioned between the silicon nitride layer 22 and the base member 10. Herein, compositions of two target layers being different includes a case where two layers are different in terms of presence or absence of at least one of the constituent elements, i.e., not all of the constituent elements of the two layers are completely the same. Further, compositions of two target layers being different includes a case where at least one of the constituent elements is in different concentration regardless of whether all of the constituent elements of the two layers are completely the same or not.

In terms of transmissivity to visible light and a refractive index higher than that of pure silicon oxide or typical transparent resin, the silicon nitride layers 21 and 22 containing silicon (Si) and nitrogen (N) are suitable for the material of the lenses 201, 202, and 203. Increasing the height of the lenses 201, 202, and 203 is effective for increasing the power of the lenses 201, 202, and 203. In this case, if each of the lenses 201, 202, and 203 is formed as a single-layered thick silicon nitride layer, internal stress of the single-layered thick silicon nitride layer will be increased. In FIG. 1A, the silicon nitride layer 21 and the silicon nitride layer 22 have thicknesses of Ta and Tb respectively. If the interlayer 23 is not arranged therebetween, the silicon nitride layers 21 and 22 are arranged continuously, so that the lens array 200 consists of a single-layered thick silicon nitride layer having a thickness of Ta+Tb. The thicker the silicon nitride layer is, the greater the internal stress of the silicon nitride layer will be. If the internal stress of the silicon nitride layer is greater, the optical characteristics of the lens array 200 is lowered due to distortion arising in the lens array 200. With respect to the above issue, the silicon nitride layers 21 and 22 are arranged discontinuously by placing the interlayer 23 therebetween, and the increase in internal stress is suppressed. In other words, the interlayer 23 can function as a stress mitigation layer between the silicon nitride layers 21 and 22. It is only necessary to make a composition of the interlayer 23 different from that of the silicon nitride layers 21 and 22, so that the silicon nitride layers 21 and 22 are arranged in a compositionally discontinuous state.

It is preferable that a thickness Tc of the interlayer 23 be less than a thickness Ta of the silicon nitride layer 21

(Tc<Ta). It is preferable that the thickness Tc of the interlayer 23 be less than a thickness Tb of the silicon nitride layer 22 (Tc<Tb). By making the thickness Tc of the interlayer 23 smaller than the thickness Ta of the silicon nitride layer 21 and the thickness Tb of the silicon nitride layer 22, it is possible to make optical influence caused by the interlayer 23 be smaller than optical influence caused by the silicon nitride layers 21 and 22. If the thickness Tc of the interlayer 23 is greater than or equal to the thickness Ta of the silicon nitride layer 21 and the thickness Tb of the silicon nitride layer 22, light refraction occurring in the interlayer 23 will be great and cannot be ignored with respect to light refraction occurring in the silicon nitride layers 21 and 22. As a result, aberration such as spherical aberration, coma aberration, or astigmatism occurs in the lenses 201, 202, and 203, and the optical characteristics thereof will be lowered. The optical characteristics can be improved by making the thickness Tc of the interlayer 23 less than the thickness Ta of the silicon nitride layer 21 and the thickness Tb of the silicon nitride layer 22. For example, because a light path length in the interlayer 23 can be shorter than the light path lengths in the silicon nitride layers 21 and 22, influence of refraction in the interlayer 23 can be less than influence of refraction in the silicon nitride layers 21 and 22. Although the interlayer 23 can constitute a lens curved surface in a strict sense, constituting the lens curved surface with the interlayer 23 is not essential. This is because a concept of the present exemplary embodiment is to make the silicon nitride layers 21 and 22 serve as main refraction members of the lens, and thus it is ideal that the interlayer 23 should not have a practical function of a refraction member.

The thickness Tc of the interlayer 23 can be less than or equal to one-tenth the thickness Ta of the silicon nitride layer 21 (Tc≤Ta/10). The thickness Tc of the interlayer 23 can be less than or equal to one-tenth the thickness Tb of the silicon nitride layer 22 (Tc≤Tb/10). The thickness Tc of the interlayer 23 can be less than or equal to one-tenth the sum of the thickness Ta of the silicon nitride layer 21 and the thickness Tb of the silicon nitride layer 22 (Tc≤(Ta+Tb)/10). The thickness Tc of the interlayer 23 can be less than or equal to one-hundredth the sum of the thickness Ta of the silicon nitride layer 21 and the thickness Tb of the silicon nitride layer 22 (Tc≤(Ta+Tb)/100). For example, a sum of the thickness Ta of the silicon nitride layer 21 and the thickness Tb of the silicon nitride layer 22 is 800 nm or more (Ta+Tb≥800 nm) and 1000 nm or more (Ta+Tb≥1000 nm), for example. The thickness Ta of the silicon nitride layer 21 is, for example, 100 nm or more, 300 nm or more, 500 nm or more, 1000 nm or less, and 800 nm or less. The thickness Tb of the silicon nitride layer 22 is, for example, 100 nm or more, 300 nm or more, 1000 nm or less, 800 nm or less, and 500 nm or less. The thickness Tb of the silicon nitride layer 22 can be less than the thickness Ta of the silicon nitride layer 21 (Ta>Tb). The thickness Tc of the interlayer 23 can be less than 20 nm (Tc<20 nm). If the thickness Tc of the interlayer 23 is less than 20 nm, optical influence of the interlayer 23 with respect to visible light is almost negligible. It is preferable that the thickness Tc of the interlayer 23 satisfy a condition "Nc×Tc<λ/10" where a wavelength of light incident on each of the lenses 201, 202, and 203 is "λ" and a refractive index of the interlayer 23 is "Nc". An optical film thickness of the interlayer 23 is expressed as "Nc×Tc". The interlayer 23 formed by oxidizing a silicon nitride layer has a refractive index of 1.5 to 2.0 when a refractive index of silicon nitride ($Si_3N_4$) having a stoichiometric composition is 2.0 and a refractive index of silicon nitride ($SiO_2$) having a stoichiometric composition is 1.5. Herein, incident light is visible light. Further, a wavelength of the visible light is assumed to be 400 nm to 800 nm. If the thickness Tc is less than 20 nm, the condition "Nc×Tc<λ/10" is satisfied when the refractive index Nc of the interlayer 23 is 2.0 or less and the wavelength of the incident light is 400 nm or more. The thickness Tc of the interlayer 23 can be 5 nm or less (Tc≤5 nm). If the interlayer 23 has the refractive index Nc of 8.0, the condition "Nc×Tc<λ/10" is satisfied when the wavelength of the incident light is 400 nm or more and the thickness Tc is less than 5 nm. Accordingly, even when a high refractive index material such as monocrystalline silicon having a refractive index of 5.6 to 3.5 is used for the interlayer 23, refraction arising in the interlayer 23 has little influence on the optical characteristics with respect to the incident light having a wavelength of 400 nm or more. Further, even when the interlayer 23 has light absorption characteristics, loss of light caused by absorption of light is negligible if the thickness Tc is less than 20 nm, especially, when the thickness Tc is less than 5 nm. The interlayer 23 is at least thicker than a monoatomic layer, and the thickness Tc of the interlayer 23 can be 1 Å or more (Tc≥1 Å). The thickness Tc of the interlayer 23 can be 1 nm or more (Tc≥1 nm).

A distance between the silicon nitride layer 21 and the interlayer 23 can be less than the thickness Tc of the interlayer 23. In the present exemplary embodiment, the silicon nitride layer 21 and the interlayer 23 are in contact with each other, so that the distance between the silicon nitride layer 21 and the interlayer 23 is zero. A distance between the silicon nitride layer 22 and the interlayer 23 can be less than the thickness Tc of the interlayer 23. In the present exemplary embodiment, the silicon nitride layer 22 and the interlayer 23 are in contact with each other, so that the distance between the silicon nitride layer 22 and the interlayer 23 is zero.

The optical apparatus 930 may include an antireflection layer 24 arranged along the curved surface of the lens. The antireflection layer 24 of the present exemplary embodiment is a layer (silicon oxynitride layer) containing silicon, nitrogen, and oxygen. The optical apparatus 930 may include a planarization layer 25 on a side opposite to the base member 10 with respect to the lens array 200. Although the planarization layer 25 of the present exemplary embodiment is a layer containing silicon and oxygen (silicon oxide layer), the planarization layer 25 may be a layer (resin layer) containing resin. A lower surface of the planarization layer 25 has a shape that follows a shape of the lens curved surface, and an upper surface of the planarization layer 25 is flatter than the lower surface thereof and the lens curved surface. The antireflection layer 24 of the present exemplary embodiment is arranged between the planarization layer 25 and the lens array 200, and reflection of light incident on the lens array 200 via the planarization layer 25 is suppressed thereby. The planarization layer 25 can be brought into contact with the lens array 200 by omitting the antireflection layer 24. It is possible to make light be incident on the lens array 200 from an external medium such as air by omitting the planarization layer 25. In this case, arranging the antireflection layer 24 is also useful. It is preferable that the antireflection layer 24 have a refractive index of a value between the refractive indexes of the silicon nitride layers 21 and 22 and a refractive index of a medium (in the present exemplary embodiment, the planarization layer 25) on the light incident side with respect to the lens array 200. It is also possible to make light be directly incident on the lens array 200 from the external medium by omitting both the antireflection layer 24 and the planarization layer 25.

A thickness Td of the antireflection layer 24 may be less than the thickness Ta of the silicon nitride layer 21 (Td<Ta). The thickness Td of the antireflection layer 24 may be less than the thickness Tb of the silicon nitride layer 22 (Td<Tb). It is preferable that the thickness Td of the antireflection layer 24 be greater than the thickness Tc of the interlayer 23 (Tc<Td). Further, by making the thickness Tc of the interlayer 23 be less than the thicknesses of the other layers, the optical effect caused by the interlayer 23 is reduced in comparison to the optical effect caused by the layer other than the interlayer 23. Thus, it is possible to reduce the optical influence of the interlayer 23. For example, the thickness Td of the antireflection layer 24 may be 100 nm or less, 20 nm or more, and 50 nm or more. A distance between the silicon nitride layer 21 and the antireflection layer 24 can be less than the thickness Tb of the silicon nitride layer 22. A distance between the silicon nitride layer 21 and the antireflection layer 24 can be less than the thickness Td of the antireflection layer 24. In the present exemplary embodiment, the silicon nitride layer 21 and the antireflection layer 24 are in contact with each other, so that the distance between the silicon nitride layer 21 and the antireflection layer 24 is zero. A distance between the silicon nitride layer 22 and the antireflection layer 24 can be less than the thickness Td of the antireflection layer 24. In the present exemplary embodiment, the silicon nitride layer 22 and the antireflection layer 24 are in contact with each other, so that the distance between the silicon nitride layer 22 and the antireflection layer 24 is zero.

The antireflection layer 24 has concavity and convexity that follow the lens curved surface of the lens array 200. Contrary to the antireflection layer 24 having the concavity and convexity, the interlayer 23 has flatness that follows the main surface of the base member 10, and a height difference of the interlayer 23 from the base member 10 is less than the concavity and convexity of the antireflection layer 24. The concavity and convexity of the antireflection layer 24 is caused by concavity and convexity of the silicon nitride layers 21 and 22, which are less than or equal to the thicknesses Ta and Tb of the silicon nitride layers 21 and 22. A height difference of the interlayer 23 from the base member 10 can be less than the thickness Ta of the silicon nitride layer 21. A height difference of the interlayer 23 from the base member 10 can be less than the thickness Tb of the silicon nitride layer 22.

The planarization layer 25 and the antireflection layer 24 have portions (intermediary portions) positioned between the plurality of lenses 201, 202, and 203. The layer that constitutes the lenses 201, 202, and 203 is positioned between the intermediary portions and the base member 10 to form extending portions 204, 205, 206, and 207. In the present exemplary embodiment, the extending portions 204, 205, 206, and 207 is formed by the silicon nitride layer 21. In other words, the silicon nitride layer 21 extends in the portions between the intermediary portions and the base member 10. The extending portions 204, 205, 206, and 207 can be also formed by the interlayer 23 and the silicon nitride layer 22. However, as described in the present exemplary embodiment, it is preferable that the silicon nitride layer 22 be discontinued at the portions between the plurality of lenses 201, 202, and 203.

Further, as described in the present exemplary embodiment, it is preferable that the interlayer 23 be discontinued at the portions between the plurality of lenses 201, 202, and 203. Arranging the silicon nitride layer 22 and the interlayer 23 to be discontinued at the portions between the plurality of lenses 201, 202, and 203 is advantageous for improving the optical characteristics of the plurality of lenses 201, 202, and 203. A thickness Te of the silicon nitride layer 21 at the extending portions 204, 205, 206, and 207 can be less than the thickness Ta of the silicon nitride layer 21 at the lenses 201, 202, and 203 (Te<Ta). For example, the thickness Te may be less than or equal to one-half the thickness Ta, less than or equal to one-third the thickness Ta, and more than or equal to one-fourth the thickness Ta. The thickness Te of the silicon nitride layer 21 at the extending portions 204, 205, 206, and 207 can be less than the thickness Tb of the silicon nitride layer 22 (Te<Tb). For example, the thickness Te may be less than or equal to one-half the thickness Tb, and more than or equal to one-fourth the thickness Tb. The thickness Te may be greater than the thickness Td (Td<Te). The thickness Te is, for example, 100 nm or more, 500 nm or less, and 300 nm or less.

Figure 1B:
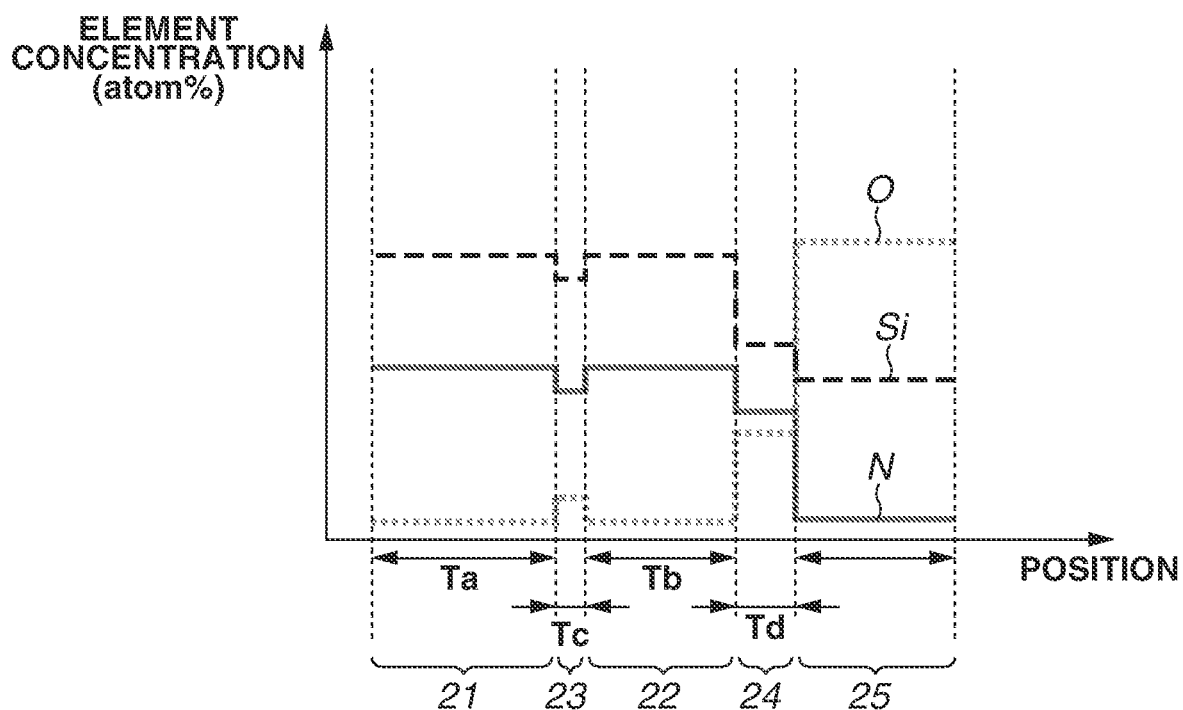

FIG. 1B is a diagram illustrating concentration distributions of silicon (Si), nitrogen (N), and oxygen (O) at a portion including the silicon nitride layers 21 and 22, the interlayer 23, the antireflection layer 24, and the planarization layer 25. Herein, unless otherwise specified, a unit of concentration is "atom %", concentration expressed in atom % is called "relative concentration", and concentration expressed in atom/cm$^3$ is called "absolute concentration". A denominator of the relative concentration represents the number of atomic elements excluding light elements.

In order to describe the concentration distributions illustrated in FIG. 1B, silicon concentration, nitrogen concentration, and oxygen concentration are expressed as "Si[Q]", "N[Q]", and "O[Q]", respectively, where a symbol "Q" takes reference numerals of the respective layers 21, 22, 23, 24, and 25. For example, nitrogen concentration of the silicon nitride layer 21 is expressed as "N[21]" because "Q" takes "21" (Q=21), and oxygen concentration of the interlayer 23 is expressed as "O[23]" because "Q" takes 23 (Q=23). As illustrated in FIG. 1B, for example, a relationship between the respective silicon concentrations satisfies a condition "Si[25]<Si[24]<Si[23]<Si[21]=Si[22]". A relationship between the respective nitrogen concentrations satisfies a condition "N[25]<N[24]<N[23]<N[21]=N[22]", for example. A relationship between the respective oxygen concentrations satisfies a condition "O[21]=O[22]<O[23] <O[24]<O[25]", for example. Satisfying at least a part of the relationships between compositions of the respective layers 21, 22, 23, 24, and 25 is advantageous for improving the optical characteristics of the plurality of lenses 201, 202, and 203.

The interlayer 23 may contain oxygen. The oxygen concentration in the interlayer 23 is higher than the oxygen concentration in the silicon nitride layer 21. Further, the oxygen concentration in the interlayer 23 is higher than the oxygen concentration in the silicon nitride layer 22. The interlayer 23 of the present exemplary embodiment is formed by naturally oxidizing a surface of the silicon nitride layer. Therefore, the interlayer 23 may contain silicon, nitrogen, and oxygen. In a case where the interlayer 23 is formed by naturally oxidizing the silicon nitride layer, the silicon concentration (atom %) of the interlayer 23 may be lower than the silicon concentrations of the silicon nitride layers 21 and 22. The absolute concentration of oxygen in the interlayer 23 is higher than the absolute concentration of oxygen in each of the silicon nitride layers 21 and 22. Further, the nitrogen concentration (atom %) of the interlayer 23 may be lower than the nitrogen concentration of each of the silicon nitride layers 21 and 22. This is because the amounts of silicon and nitrogen are relatively reduced by the oxygen added to the silicon and nitrogen originally existing therein. Accordingly, the absolute concentration of nitrogen in the interlayer 23 may be equal to the absolute concentration of nitrogen in each of the silicon nitride layer 21 and 22, and the absolute concentration of silicon in the interlayer 23 may be equal to the absolute concentration of silicon in each of the silicon nitride layers 21 and 22. As another example of a composition of the interlayer 23, the interlayer 23 may contain carbon. The interlayer 23 containing carbon can be formed by making organic substances be adsorbed on a surface of the silicon nitride layer. In this case, the interlayer 23 may contain silicon, nitrogen, and carbon. Both natural oxidization and adsorption of organic substances may occur in the interlayer 23. In this case, the interlayer 23 may contain silicon, nitrogen, oxygen, and carbon. The interlayer 23 may be artificially formed to contain an optional element by using a film deposition apparatus. The thickness Tc of the interlayer 23 formed by natural oxidization or adsorption can be 5 nm or less (Tc≤5 nm).

If the silicon nitride layers 21 and 22 consist of silicon nitride having a stoichiometric composition, the composition thereof is $Si_3N_4$. However, each of the silicon nitride layers 21 and 22 may have a non-stoichiometric composition. Each of the silicon nitride layers 21 and 22 may contain an element other than light elements (i.e., hydrogen (H) and helium (He)) of an amount less than the amounts of silicon and nitrogen. Each of the silicon nitride layers 21 and 22 may contain an element other than the light elements of an amount greater than at least one of the amounts of silicon and nitrogen. Carbon (C), oxygen (O), fluorine (F), chlorine (Cl), and argon (Ar) are given as examples of the elements other than the light elements which may be contained in the silicon nitride layers 21 and 22. The silicon nitride layers 21 and 22 may contain light elements (i.e., hydrogen (H) and helium (He)) of amounts greater than at least one of the amounts of silicon and nitrogen. The amount of the light element contained in the silicon nitride layers 21 and 22 may be less than the amount of silicon and the amount of nitrogen.

The oxygen concentration of the antireflection layer 24 may be higher than the oxygen concentration of the interlayer 23. If an amount of oxygen contained in the interlayer 23 is large, a difference between the refractive index of the interlayer 23 and the refractive index of each of the silicon nitride layers 21 and 22 becomes great, so that reflection of light occurring in the silicon nitride layers 21 and 22 will be increased. By making the oxygen concentration of the interlayer 23 be lower than the oxygen concentration of the antireflection layer 24 consisting of a silicon oxynitride layer, reflection of light occurring in the silicon nitride layers 21 and 22 can be reduced.

An example of concentration of each element in the concentration distribution illustrated in FIG. 1B will be described. The concentration can be appropriately adjusted within the below-described range of element concentration of each layer, so that a sum of the silicon concentration, the nitrogen concentration, and the oxygen concentration does not exceed 100 atom %. The silicon concentration in each of the silicon nitride layers 21 and 22 is, for example, 50 atom % or more and 80 atom % or less. For example, the silicon concentration in the interlayer 23 is 1 atom % or more, 10 atom % or more, 30 atom % or more, and 80 atom % or less. For example, the silicon concentration in each of the antireflection layer 24 and the planarization layer 25 is 20 atom % or more and 60 atom % or less. The nitrogen concentration in each of the silicon nitride layers 21 and 22 is, for example, 20 atom % or more, and 50 atom % or less. The nitrogen concentration in the interlayer 23 is, for example, 1 atom % or more, 10 atom % or more, 20 atom % or more, and 40 atom % or less. The nitrogen concentration in the antireflection layer 24 is, for example, 10 atom % or more and 40 atom % or less. The nitrogen concentration in the planarization layer 25 is, for example, less than 10 atom %, less than 1 atom %, and equal to 0 atom %. The oxygen concentration in the planarization layer 25 is, for example, 50 atom % or more and 80 atom % or less. The oxygen concentration in the antireflection layer 24 is, for example, 10 atom % or more and 40 atom % or less. The oxygen concentration in the interlayer 23 is, for example, 1 atom % or more, 10 atom % or more, 60 atom % or less, and 20 atom % or less. The oxygen concentration in each of the silicon nitride layers 21 and 22 is, for example, less than 10 atom %, less than 1 atom %, and equal to 0 atom %.

FIGS. 2A to 2F are cross-sectional schematic diagrams illustrating a processing sequence of a manufacturing method of the optical apparatus 930 in FIG. 1A.

Figure 2A:
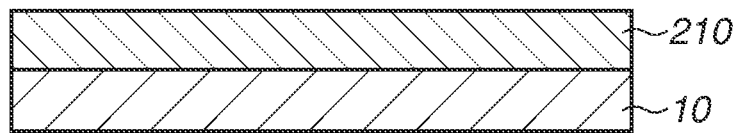
FIGS. 2A to 2F are schematic diagrams illustrating a method of forming a lens array.

In the process-a illustrated in FIG. 2A, a silicon nitride film 210 is formed on the base member 10. The silicon nitride film 210 eventually constitutes the silicon nitride layer 21.

Figure 2B:
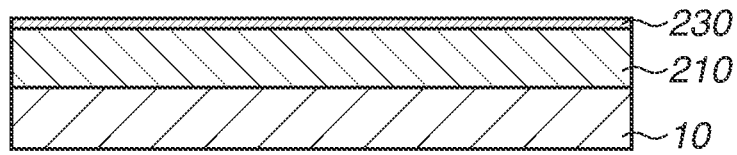

In the process-b illustrated in FIG. 2B, a different composition film 230 having a composition different from that of the silicon nitride film 210 is formed on the silicon nitride film 210. The different composition film 230 eventually constitutes the interlayer 23. A thickness of the different composition film 230 can be less than a thickness of the silicon nitride film 210. It is preferable that the thickness of the different composition film 230 be less than or equal to one-tenth the thickness of the silicon nitride film 210. It is more preferable that the thickness of the different composition film 230 be less than or equal to one-hundredth the thickness of the silicon nitride film 210. The different composition film 230 can be formed by naturally oxidizing the silicon nitride film 210 within a chamber of the film deposition apparatus for the silicon nitride film 210 by introducing oxygen-containing gas such as air into the chamber thereof. The different composition film 230 can be also formed by naturally oxidizing the silicon nitride film 210 by taking out the silicon nitride film 210 deposited on the base member 10 from the chamber of the film deposition apparatus for the silicon nitride film 210 and exposing the silicon nitride film 210 to oxygen-containing gas such as air. The different composition film 230 can be also formed by making the silicon nitride film 210 adsorb organic substances in the atmosphere of the chamber of the film deposition apparatus for the silicon nitride film 210. The different composition film 230 can be formed under a deposition condition different from the deposition condition of the silicon nitride film 210 by using the film deposition apparatus for the silicon nitride film 210 or a film deposition apparatus different from the film deposition apparatus for the silicon nitride film 210. The different composition film 230 can be formed by any one of a sputtering method, a vapor deposition method, a thermal chemical vapor deposition (CVD) method, a plasma CVD method, and an atomic layer deposition (ALD) method.

Figure 2C:
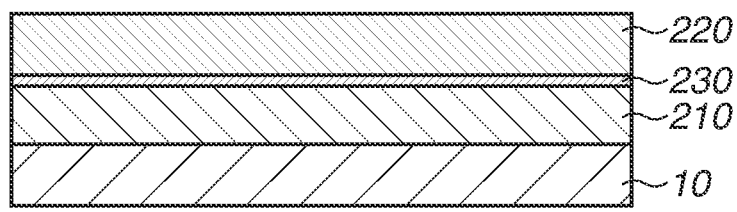

In the process-c illustrated in FIG. 2C, a silicon nitride film 220 is formed on the different composition film 230. The silicon nitride film 220 eventually constitutes the silicon nitride layer 22. The thickness of the silicon nitride film 220 can be greater than the thickness of the different composition film 230. It is preferable that the thickness of the silicon nitride film 220 be more than or equal to ten times the thickness of the different composition film 230. It is more preferable that the thickness of the silicon nitride film 220 be more than or equal to one hundred times the thickness of the different composition film 230.

The silicon nitride films 210 and 220 can be formed by any one of a sputtering method, a vapor deposition method, a thermal CVD method, a plasma CVD method, and an ALD method. It is preferable that the silicon nitride films 210 and 220 be formed by the CVD method in order to realize refractive indexes and transmissivities favorable for the silicon nitride layers 21 and 22 of the lenses 201, 202, and 203. When considering the stress caused by thermal expansion of the base member 10 generated at the time of forming the silicon nitride films 210 and 220, it is preferable that the silicon nitride films 210 and 220 be formed by the plasma CVD method rather than the thermal CVD method. Thicker silicon nitride films 210 and 220 are advantageous for increasing the heights (thicknesses) of the lenses 201, 202, and 203, and also advantageous for reducing the number of surface boundaries of foreign materials generated in the lenses 201, 202, and 203. For example, the thickness of each of the silicon nitride films 210 and 220 can be 100 nm or more, 300 nm or more, and 500 nm or more. On the other hand, the stress generated in the silicon nitride films 210 and 220 increases as the silicon nitride films 210 and 220 get thicker. Thus, the thickness of each of the silicon nitride films 210 and 220 can be 1000 nm or less, and 800 nm or less, for example.

Figure 2D:
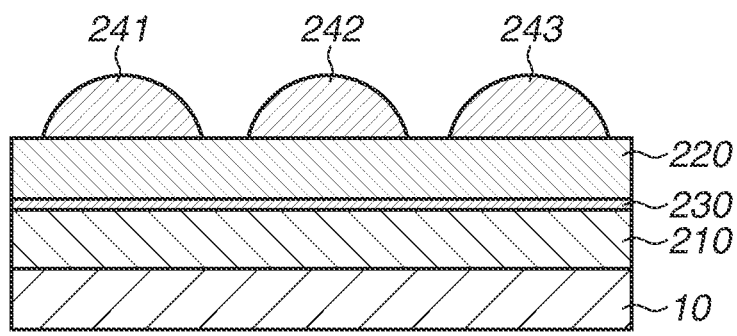

In the process-d illustrated in FIG. 2D, transfer members 241, 242, and 243 are formed on the silicon nitride film 220. Each of the transfer members 241, 242, and 243 has a substantially semi-spherical curved surface corresponding to the lens curved surface of each of the lenses 201, 202, and 203 formed subsequently. For example, the transfer members 241, 242, and 243 are made of photosensitive resin. A photosensitive resinous pattern is formed by exposing, developing, and patterning a photosensitive resinous film (photoresist film) using a reticle (photomask), and the transfer members 241, 242, and 243 having the curved surfaces can be formed by reflowing the photosensitive resinous pattern. Alternatively, the photosensitive resinous film is exposed to have an exposure amount distribution according to a transmissivity distribution (tone) of a halftone reticle, and the transfer members 241, 242, and 243 having the curved surfaces with film thickness distributions according to that exposure amount distribution may be formed by developing the photosensitive resinous film. In any of the above-described cases, when the photosensitive resin which constitutes the transfer members 241, 242, and 243 is to be exposed to light through an exposure machine, a position of a pattern formed on the base member 10 serving as a base material and a position of a reticle are adjusted (aligned) to each other. If large internal stress is generated in the silicon nitride film serving as the base material of the transfer members 241, 242, and 243 when the alignment is performed, an alignment error will be greater. However, by overlaying the silicon nitride films 210 and 220 with the different composition film 230 interposed therebetween, increase in the thickness of the continuous silicon nitride films is suppressed, so that the stress generated in the silicon nitride film serving as the base material of the transfer members 241, 242, and 243 can be reduced. As a result, deterioration of the overlay accuracy can be suppressed, and the alignment accuracy can be improved.

Figure 2E:
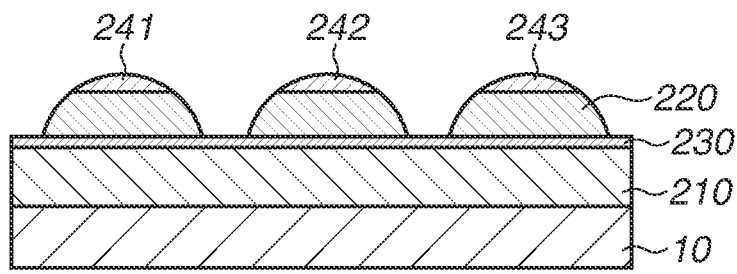

In the process-e illustrated in FIG. 2E, etching is applied on the silicon nitride film 220 by using the transfer members 241, 242, and 243. At this time, if etching is performed under a condition in which a small etching selection ratio (e.g., selection ratio from 1 to 10) is applied to the transfer members 241, 242, and 243 and the silicon nitride film 220, curved shapes of the transfer members 241, 242, and 243 are transferred to the silicon nitride film 220. In the process-e, the different composition film 230 may be exposed. At this stage, a part of the transfer members 241, 242, and 243 may remain on top of the silicon nitride film 220.

Figure 2F:
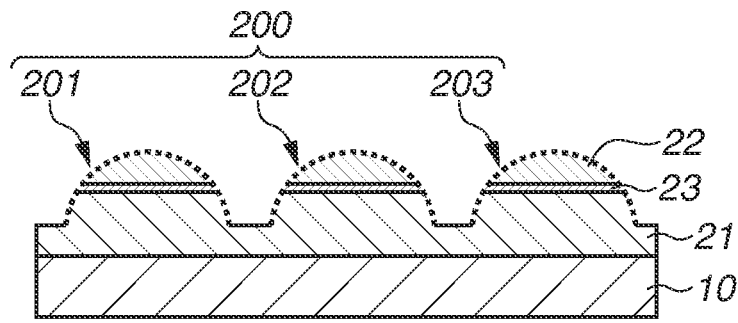

Subsequent to the process-e, in the process-f illustrated in FIG. 2F, etching is applied on the silicon nitride film 220, the different composition film 230, and the silicon nitride film 210. Through the above processes, the lenses 201, 202, and 203 are formed by transferring the shapes of the transfer members 241, 242, and 243 to the silicon nitride film 220, the different composition film 230, and the silicon nitride film 210. In the process-f, while etching can be performed under a condition different from that of the process-e, the etching condition the same as that of the process-e can also be applied. If the thickness of the different composition film 230 is less than the thicknesses of the silicon nitride films 210 and 220, a decrease in etching throughput caused by the different composition film 230 is less even when the etching rate of the different composition film 230 is lower than the etching rate of each of the silicon nitride films 210 and 220.

In the process-a to the process-c, the film deposition method does not have to be changed between the silicon nitride film 210 formed first and the silicon nitride film 220 formed later. However, the silicon nitride films 210 and 220 may be formed in such a state that a stress distribution of one of the silicon nitride films 210 and 220 becomes greater than that of another of the silicon nitride films 210 and 220. In this case, it is preferable that the stress distribution of the silicon nitride film 210 formed first be greater than that of the silicon nitride film 220 formed later (condition 1). A stress mitigation effect acquired by forming the different composition film 230 is higher in the condition 1 in comparison to a case (condition 2) where the stress distribution of the silicon nitride film 210 formed first is less than that of the silicon nitride film 220 formed later. The degree of the above-described stress mitigation effect was acquired as a result of evaluation based on the overlay accuracy of the patterned lenses 201, 202, and 203 and a pattern formed on the base member 10 serving as the base material. Through the examination conducted by engineers, 20% improvement in the overlay accuracy was confirmed under the condition 1 when compared to that under the condition 2.

Figure 3A:
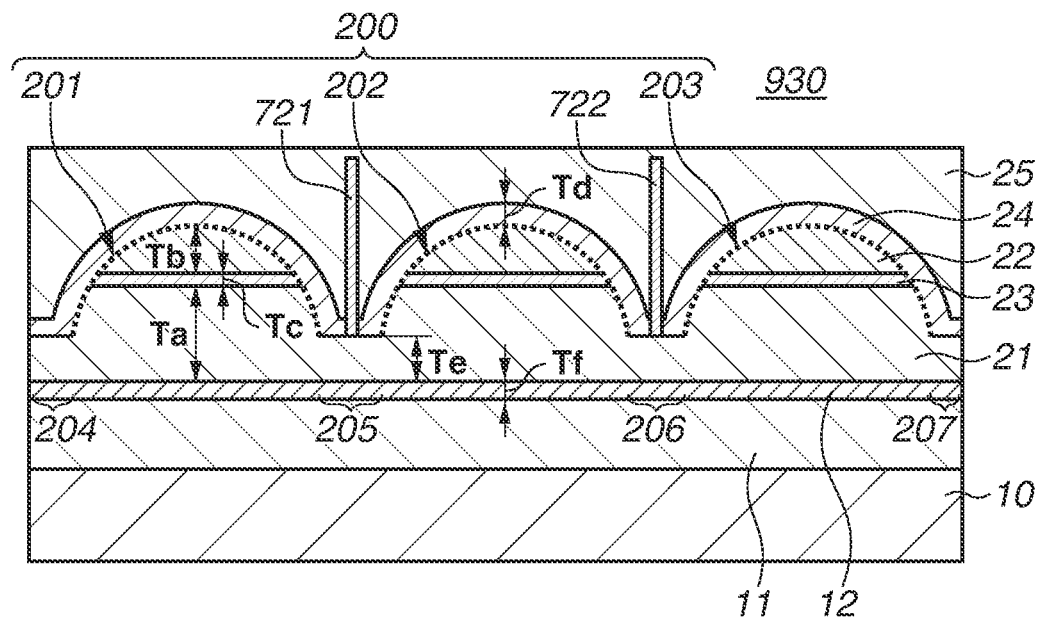
FIGS. 3A and 3B are schematic diagrams illustrating an optical apparatus.

FIG. 3A is a diagram illustrating a variation example of the example illustrated in FIG. 1A. The optical apparatus 930 includes light shielding walls 721 and 722 between the plurality of lenses 201, 202, and 203. The light shielding walls 721 and 722 are made of metal such as tungsten. Occurrence of crosstalk of light incident on the lenses 201, 202, and 203 can be suppressed by arranging the light shielding walls 721 and 722. In the present exemplary embodiment, the light shielding walls 721 and 722 of the present exemplary embodiment penetrate through the antireflection layer 24 and is in contact with the silicon nitride layer 21. However, each of the light shielding walls 721 and 722 may be separated from the silicon nitride layer 21 via the antireflection layer 24 arranged between the light shielding walls 721 and 722 and the silicon nitride layer 21.

The optical apparatus 930 according to the variation example in FIG. 3A can include a low refractive index layer 11 arranged between the lens array 200 and the base member 10. The low refractive index layer 11 has a refractive index lower than the silicon nitride layers 21 and 22. The low refractive index layer 11 of the present exemplary embodiment is a layer (silicon oxide layer) containing silicon and oxygen. The optical apparatus 930 may include an antireflection layer 12 arranged between the lens array 200 and the base member 10. The antireflection layer 12 has a refractive index of a value between the refractive indexes of the low refractive index layer 11 and the silicon nitride layer 21, lower than the silicon nitride layers 21 and 22. The antireflection layer of the present exemplary embodiment is a layer (silicon oxynitride layer) containing silicon, nitrogen, and oxygen. The antireflection layer 12 may have a composition similar to that of the antireflection layer 24. Similar to the case of the thickness Td of the antireflection layer 12, a thickness Tf of the antireflection layer 12 may be less than the thickness Ta of the silicon nitride layer 21 and the thickness Tb of the silicon nitride layer 22, and may be greater than the thickness Tc of the interlayer 23. The thickness Tf of the antireflection layer 12 is, for example, 100 nm or less, 20 nm or more, and 50 nm or more.

In FIGS. 1A and 3A, for example, a relationship between thicknesses of the respective layers satisfies a condition "Tc<10 nm<Td=Tf<100 nm<Te<Tb<Ta<1000 nm<Ta+Tb". Satisfying at least a part of the relationship between the thicknesses of the respective layers is advantageous for improving the optical characteristics of the plurality of lenses 201, 202, and 203.

Figure 3B:
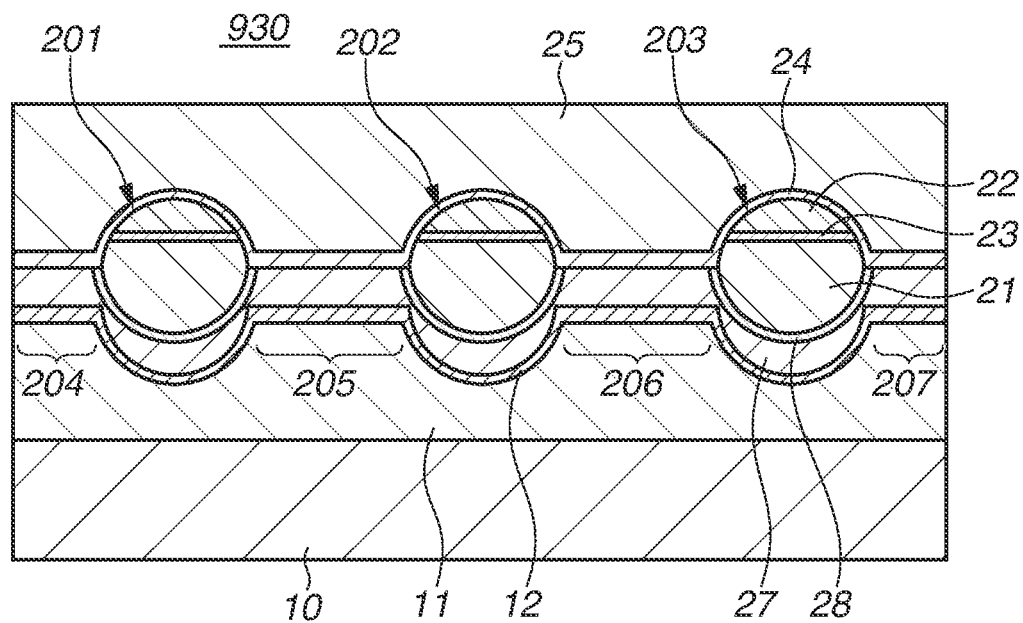

FIG. 3B is a diagram illustrating a variation example of the example illustrated in FIG. 1A. The plurality of lenses 201, 202, and 203 included in the optical apparatus 930 are biconvex lenses. Of the lens curved surfaces, convex surfaces on the opposite side of the base member 10 is formed by the silicon nitride layers 21 and 22, and the interlayer 23 is positioned between the silicon nitride layers 21 and 22. This configuration is common to the example illustrated in FIG. 1A. In the example in FIG. 3B, of the lens curved surfaces, convex surfaces on a side of the base member 10 include a silicon nitride layer 27, and an interlayer 28 is positioned between the silicon nitride layers 27 and 21. A composition and a thickness of the silicon nitride layer 27 may be similar to those of the silicon nitride layer 21, and a composition and a thickness of the interlayer 28 may be similar to those of the interlayer 23. The low refractive index layer 11 having a concave surface is positioned between the lenses 201, 202, and 203, and the antireflection layer 12 is positioned along the concave surface of the low refractive index layer 11. The above-described structure is formed as follows. A silicon oxynitride film for constituting the antireflection layer 12 and a silicon nitride film for constituting the silicon nitride layer 27 are formed on the low refractive index layer 11 having the concave surface, and a different composition film for constituting the interlayer 28 is formed on the silicon nitride film for constituting the silicon nitride layer 27. A silicon nitride film for constituting the silicon nitride layer 21 is formed on the different composition film for constituting the interlayer 28, and the silicon nitride film for constituting the silicon nitride layer 21 is planarized through a method such as a chemical mechanical planarization (CMP) method. A different composition film for constituting the interlayer 23 and a silicon nitride film for constituting the silicon nitride layer 22 are formed on the planarized silicon nitride film for constituting the silicon nitride layer 21. Thereafter, through a method similar to the method described in FIG. 2, the silicon nitride film for constituting the silicon nitride layer 22, the different composition film for constituting the interlayer 23, the silicon nitride film for constituting the silicon nitride layer 21, and the different composition film for constituting the interlayer 28 are etched sequentially, so that a convex surface on the opposite side of the base member 10 is formed.

In the examples illustrated in FIGS. 1A, 3A, and 3C, a lens curved surface is mainly formed by two silicon nitride layers 21 and 22. However, the lens curved surface may include three or more silicon nitride layers. Then, interlayers thinner than the silicon nitride layers, having compositions different from the composition of the silicon nitride layers, may be arranged between the respective silicon nitride layers. It is preferable that the number of silicon nitride layers which constitute the lens curved surface be greater than the number of interlayers. The number of silicon nitride layers which constitute the lens curved surface can be greater than three halves of the number of interlayers and less than three times the number of interlayers.

Figure 4A:
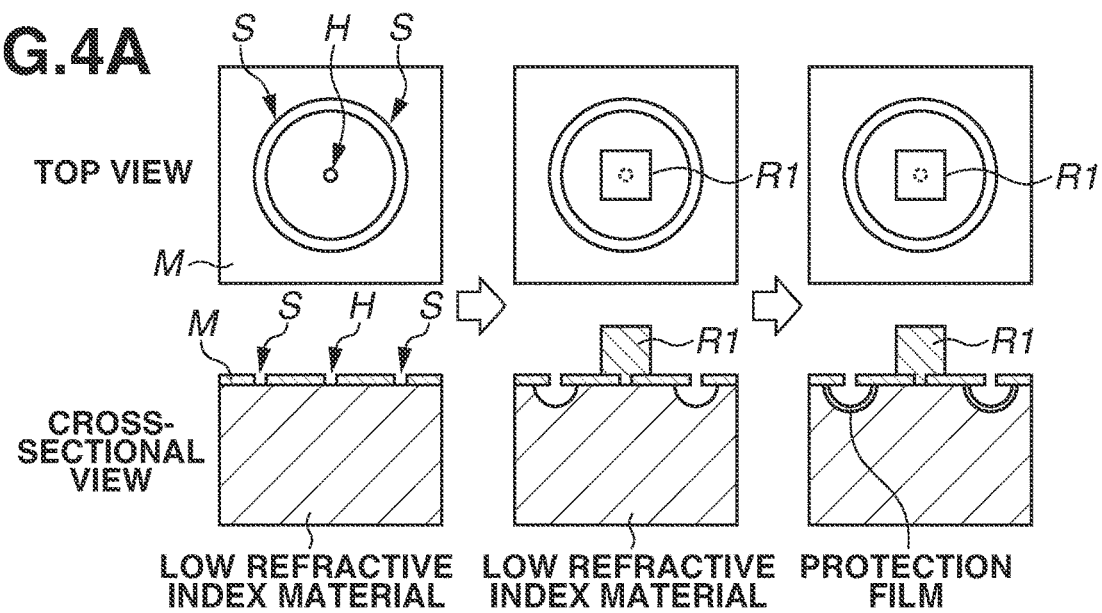
FIGS. 4A, 4B, and 4C are schematic diagrams illustrating a method of forming a lens array.
Figure 4B:
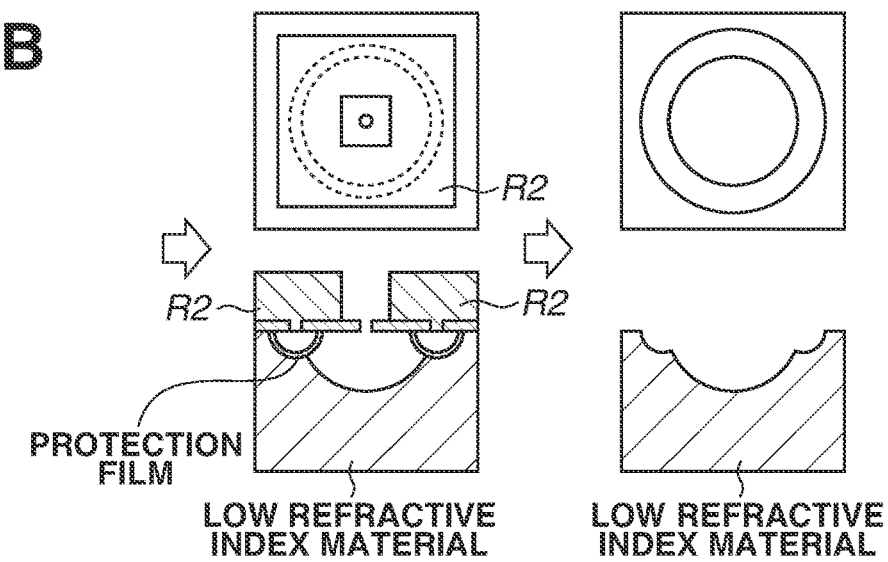
Figure 4C:
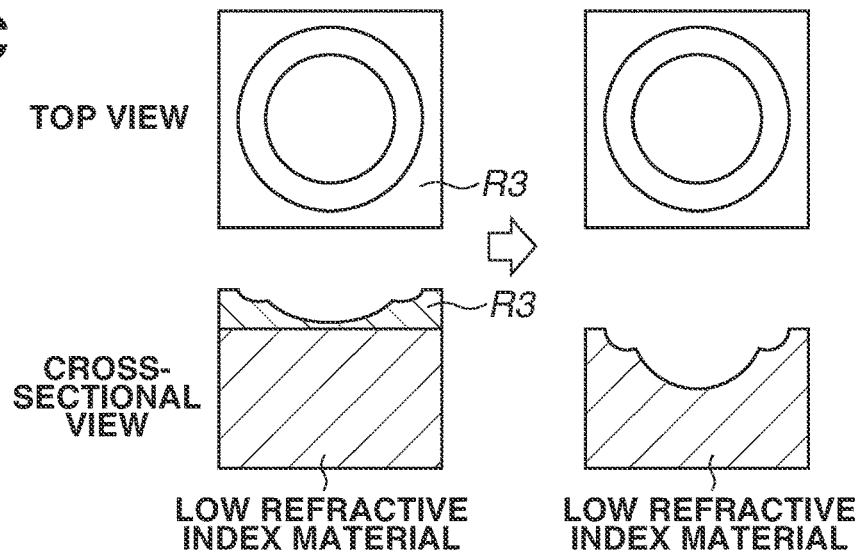

FIG. 4A is a diagram schematically illustrating a flow of processing for forming a non-spherical lower lens surface in FIG. 3B by wet etching. Generally, aberration is likely to occur with a smaller curvature radius. Therefore, aberration occurring in the biconvex intra-layer lens, in particular, spherical aberration, can be corrected by making a surface close to the base member 10 be a non-spherical surface. At the same time, by using a low refractive index material, a desired focal point distance can be acquired without reducing the curvature radius, so that the aberration can be further reduced. For example, the LAL series low refractive index material manufactured by Tokyo Ohka Kogyo Co., Ltd. has a refractive index of 1.2. The low refractive index material is formed into a concave shape, and a high refractive index material such as a silicon nitride film, having an approximate refractive index of 2, is formed thereon, so that a lower surface thereof functions as a convex lens. As illustrated in FIG. 3B, the silicon nitride films are formed in three steps with the interlayers 28 and 23 made of natural oxide films interposed therebetween. At this time, in order to reduce the spherical aberration by making a circumferential portion of the concave-shaped ultralow refractive index material be a non-spherical surface, it is preferable that a curvature of the circumferential portion be increased. For this purpose, by using a mask member M having a slit S, a concaved circumferential portion is formed by isotropically applying wet etching on the low refractive index material in a state where a hole H of the mask member M is closed with a resist RE Further, by using the mask member M having the hole H, a concaved central portion is formed by isotropically applying wet etching on the low refractive index material in a state where the slit S of the mask member M is closed with a resist R2. FIG. 4C is a schematic diagram illustrating a processing flow of another method of forming a concave shape on a low refractive index material. In the processing flow, a non-spherical lower surface of an intra-layer lens is formed by transferring a resist R3 patterned through tone-mask exposure onto a low refractive index material through an etch-back method. The concave-shaped non-spherical surface can be formed by employing the tone mask exposure and the etch-back method.

Figure 5A:
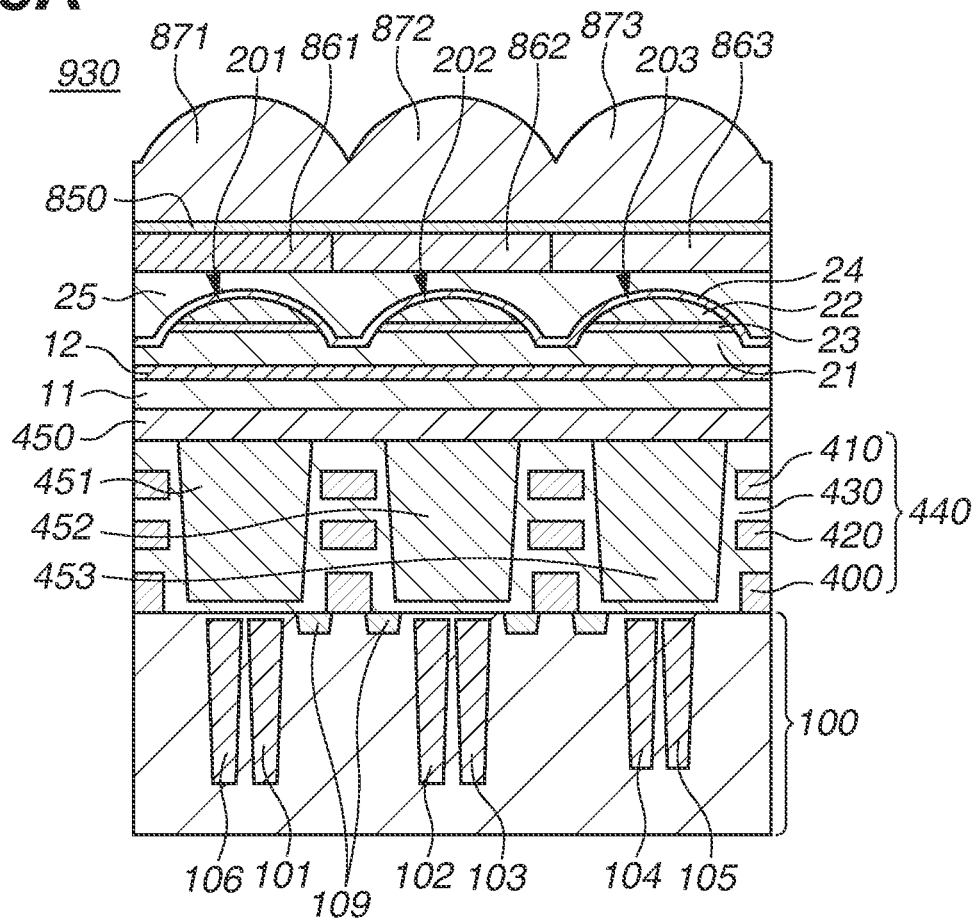
FIGS. 5A and 5B are schematic diagrams illustrating an optical apparatus.
Figure 5B:
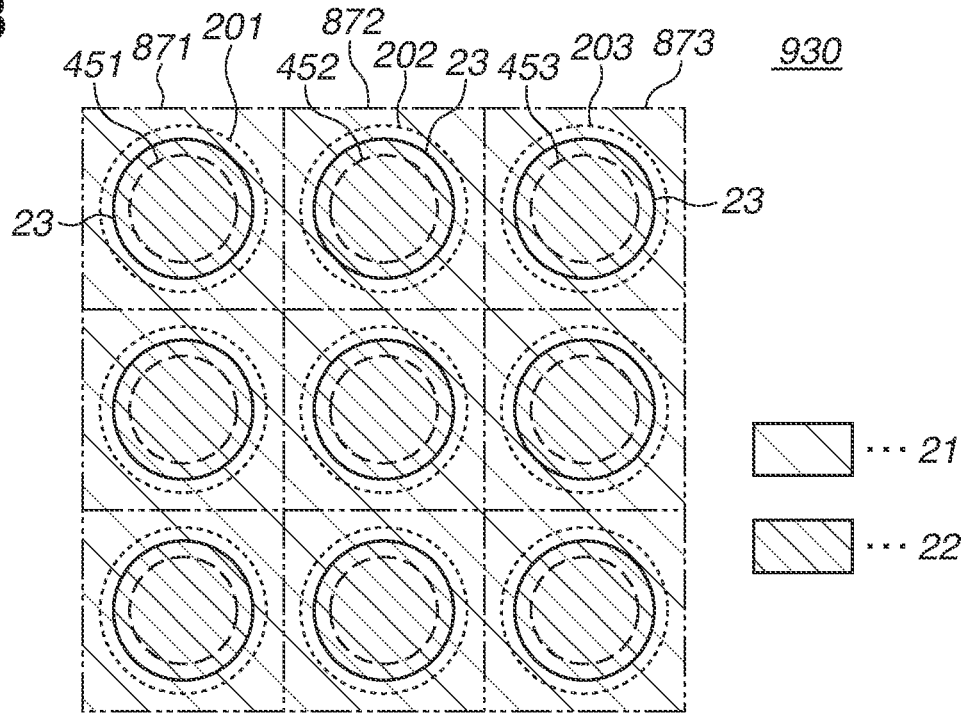

FIGS. 5A and 5B are diagrams illustrating the optical apparatus 930 serving as a front-face illumination type imaging apparatus. The base member 10 illustrated in FIGS. 1A and 3A includes a semiconductor layer 100, a wiring structure 440, light guiding portions 451, 452, and 453, and a coupling portion 450 that couples the light guiding portions 451, 452, and 453 to each other. A plurality of photodiodes 101, 102, 103, 104, 105, and 106 is arranged on the semiconductor layer 100. Each of the photodiodes 101, 102, 103, 104, 105, and 106 serves as a photoelectric conversion portion. The wiring structure 440 is positioned between the lens array 200 and the semiconductor layer 100.

The optical apparatus 930 includes a color filter array including a red color filter 861, a green color filter 862, and a blue color filter 863 arranged on the planarization layer 25. The optical apparatus 930 includes another lens array (microlens array) arranged on a side opposite to a side of the base member 10 with respect to the lens array 200. The microlens array includes microlenses 871, 872, and 873 arrayed on the color filter array via a planarization layer 850. In other words, the lenses 201, 202, and 203 of the lens array 200 can be intra-layer lenses.

Of the plurality of photodiodes 101, 102, 103, 104, 105, and 106, two or more photodiodes (in the present exemplary embodiment, photodiodes 106 and 101) correspond to the lens 201 from among the plurality of lenses 201, 202, and 203. Of the plurality of photodiodes 101, 102, 103, 104, 105, and 106, two or more photodiodes (in the present exemplary embodiment, photodiodes 102 and 103) correspond to the lens 202 from among the plurality of lenses 201, 202, and 203. Of the plurality of photodiodes 101, 102, 103, 104, 105, and 106, two or more photodiodes (in the present exemplary embodiment, photodiodes 104 and 105) correspond to the lens 203 from among the plurality of lenses 201, 202, and 203. Similarly, the photodiodes 106 and 101 correspond to the color filter 861 and the microlens 871. The photodiodes 102 and 103 correspond to the color filter 862 and the microlens 872. The photodiodes 104 and 105 correspond to the color filter 863 and the microlens 873. As described above, a pixel defined by a single lens or a color filter includes two or more photodiodes. The above-described configuration enables focus detection, ranging, and expansion of a dynamic range. As described above, light photoelectrically converted by two or more photodiodes can be separated in a case where a pixel defined by a single lens includes two or more photodiodes. In order to improve the separation accuracy, it is preferable that light be brought into focus at a position as close to one lens as possible with respect to the photodiodes. As described above, by including the silicon nitride layers 21 and 22 and the interlayer 23, power of the lenses 201, 202, and 203 can be improved by increasing the thickness thereof, while the stress in the lenses 201, 202, and 203 is reduced and deterioration of the optical characteristics is suppressed.

The wiring structure 440 includes wiring layers 410 and 420 and an interlayer insulation film 430. Each of the wiring layers 410 and 420 of the wiring structure 440 is connected to a semiconductor element arranged on the semiconductor layer 100. The semiconductor element arranged on the semiconductor layer 100 includes an electrode layer 400, and can function as a transistor that includes the electrode layer 400 as a gate electrode. The electrode layer 400 can be a polysilicon layer. The semiconductor element arranged on the semiconductor layer 100 constitutes a pixel circuit including a transfer transistor for transferring an electric charge generated by the photodiode and an amplification transistor for generating an electric signal based on the electric charge generated by the photodiode. The semiconductor element constituting the pixel circuit is separated by an element separation portion 109 having a shallow trench isolation (STI) structure. The interlayer insulation film 430 has openings, and light guiding portions 451, 452, and 453 are positioned inside the openings. The light guiding portions 451, 452, and 453 have refractive indexes higher than that of at least a part of insulation layers of the interlayer insulation film 430, and the light guiding portions 451, 452, and 453 serving as cores and at least a part of the insulation layers of the interlayer insulation film 430 serving as a clad constitutes a core-clad type light guiding structure. For example, the insulation layers serving as the clads are made from silicon oxide, and the light guiding portions 451, 452, and 453 are made from silicon nitride or resin. The interlayer insulation film 430 can be a laminate structure having two or more types of insulation layers. If a refractive index of one of the insulation layers of the interlayer insulation film 430 is different from that of another, light is reflected on a surface boundary between the different types of insulation layers, so that sensitivity thereof is lowered. An opening is formed on the interlayer insulation film 430 by partially removing the different insulation layer. Then, the light guiding portions 451, 452, and 453 may be formed by embedding a common material into that opening. For example, an opening penetrating through a silicon carbide layer and a silicon oxide layer is formed on the interlayer insulation film 430 consisting of a laminate structure of the silicon carbide layer and the silicon oxide layer, and the light guiding portions 451, 452, and 453 may be formed by embedding the silicon oxide layer into that opening.

The power of the lenses 201, 202, and 203 has to be improved in order to make light incident on the lenses 201, 202, 203 be incident on the light guiding portions 451, 452, and 453 positioned at a close distance from the lenses 201, 202, and 203. For example, a rough indication of "close distance" described above is a distance of 1 μm or less from each of the lenses 201, 202, and 203 to each of the light guiding portions 451, 452, and 453. As described above, by arranging the silicon nitride layers 21 and 22 and the interlayer 23, power of the lenses 201, 202, and 203 can be improved by increasing the thickness thereof, while the stress in the lenses 201, 202, and 203 is reduced and deterioration of the optical characteristics is suppressed.

FIG. 5B is a transparent planar view of the lens array 200 corresponding to 3-by-3 pixels. In FIG. 5B, an outline of each of the silicon nitride layer 22 and the interlayer 23 is expressed by a solid line, and an outline of each of the lenses 201, 202, and 203 is expressed by a dotted line. An outline of each of the light guiding portions 451, 452, and 453 is expressed by a dashed line, and an outline of each of the microlenses 871, 872, and 873 is expressed by a dashed two-dotted line. In FIG. 5B, only a portion of the silicon nitride layer 21 which does not overlap with the silicon nitride layer 22 and the interlayer 23 is expressed by a hatched line that represents the silicon nitride layer 21, and another portion of the silicon nitride layer 21 which overlaps with the silicon nitride layer 22 is expressed by a hatched line that represents the silicon nitride layer 22. In the example in FIG. 5B, the lenses 201, 202, and 203 have circular-shape outlines. However, the shape thereof may be a polygonal shape or a polygonal shape with rounded corners. The lenses 201, 202, and 203 are separated from each other in the up-down direction, the right-left direction, and the oblique direction in FIG. 5B. Separating the respective lenses 201, 202, and 203 from adjacent lenses is useful for improving the power of the lenses 201, 202, and 203 by reducing the widths and increasing the curvatures of the lenses 201, 202, and 203. On the other hand, the microlenses 871, 872, and 873 adjacent to each other at the boundaries in the up-down direction, the right-left direction, and the oblique direction. As a result, each of the microlenses 871, 872, and 873 has a square-shaped outline. The microlenses 871, 872, and 873 being adjacent to each other are advantageous for reducing an amount of light lost in the microlenses 871, 872, and 873. In the example in FIG. 5B, the outlines of the light guiding portions 451, 452, and 453 are included in the outlines of the silicon nitride layer 22 and the interlayer 23. In other words, the widths of the silicon nitride layer 22 and the interlayer 23 are greater than the widths of the light guiding portions 451, 452, and 453. The above-described relationship is advantageous for collecting light incident on the lenses 201, 202, and 203 to the light guiding portions 451, 452, and 453. Alternatively, the outlines of the silicon nitride layer 22 and the interlayer 23 may be included in the outlines of the light guiding portions 451, 452, and 453. In other words, the widths of the silicon nitride layer 22 and the interlayer 23 may be less than the widths of the light guiding portions 451, 452, and 453.

As a variation example of the exemplary embodiment illustrated in FIG. 5A, the light shielding walls 721 and 722 illustrated in FIG. 3A may be added to the positions between the lenses 201, 202, and 203.

Figure 6:
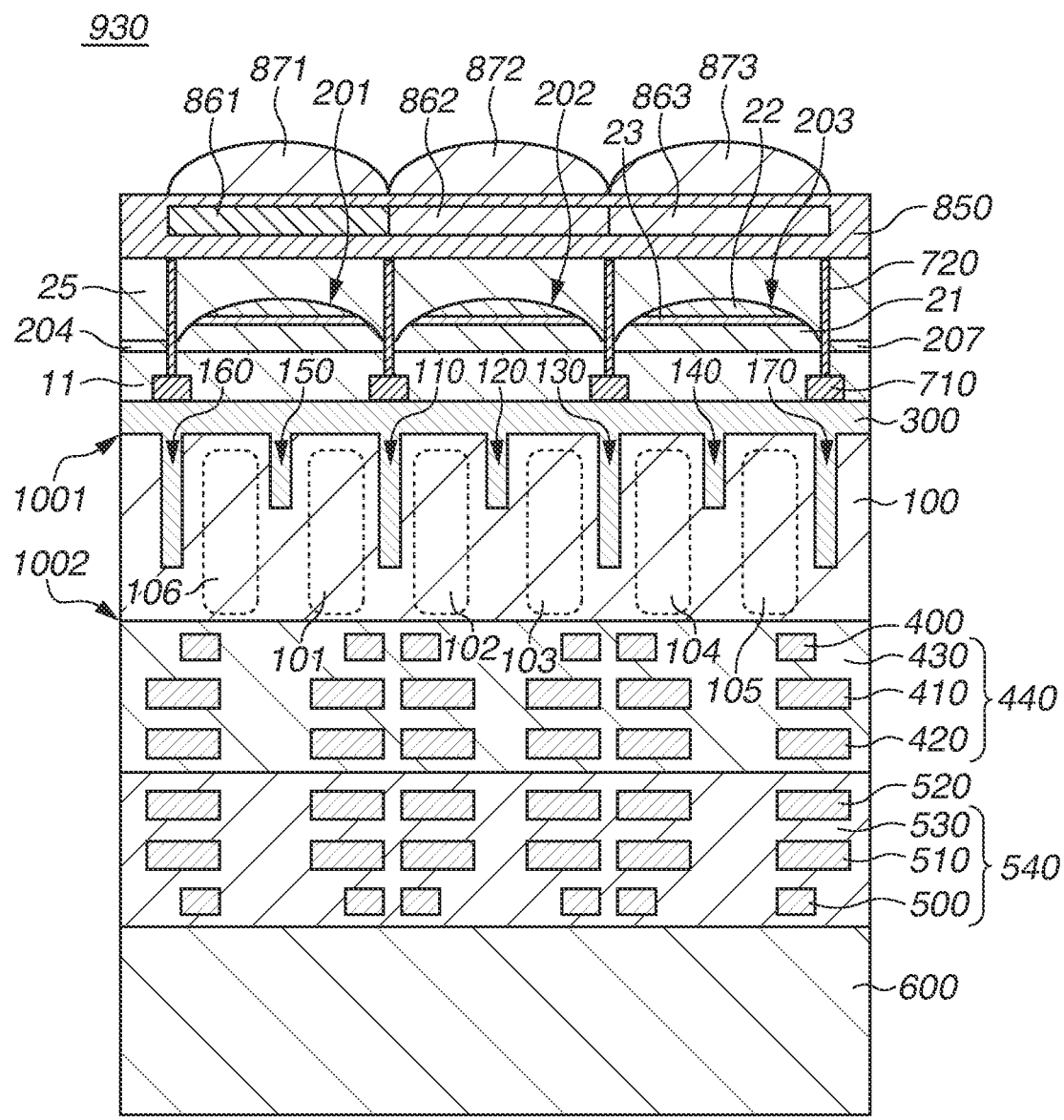
FIG. 6 is a schematic diagram illustrating an optical apparatus.

FIG. 6 is a diagram illustrating a case where the optical apparatus 930 is a back-face illumination type imaging apparatus. The base member 10 illustrated in FIGS. 1A and 3A includes a semiconductor layer 100, a wiring structure 440, a semiconductor substrate 600, and a wiring structure 540. Each of the wiring layers 410 and 420 of the wiring structure 440 is connected to a semiconductor element arranged on the semiconductor layer 100. Each of the wiring layers 510 and 520 of the wiring structure 540 is connected to a semiconductor element arranged on the semiconductor substrate 600. The semiconductor element arranged on the semiconductor substrate 600 includes an electrode layer 500, and can be a transistor that includes the electrode layer 500 as a gate electrode. The electrode layer 500 can be a polysilicon layer. The semiconductor element arranged on the semiconductor substrate 600 constitutes a peripheral circuit such as a driving circuit for driving a pixel circuit arranged on the semiconductor layer 100 or a processing circuit for processing a pixel signal output from the pixel circuit. The semiconductor layer 100 is positioned between the wiring structure 440 and the lens array 200. The semiconductor layer 100 includes a back surface 1001 and a front surface 1002. Grooves continuing from the back surface 1001 are formed on the semiconductor layer 100, and separation portions 110, 120, 130, 140, 150, 160, and 170 are formed by the grooves. The separation portion 150 is arranged between the photodiodes 101 and 106, the separation portion 120 is arranged between the photodiodes 102 and 103, and the separation portion 140 is arranged between the photodiodes 104 and 105. The separation portion 110 is arranged between the photodiodes 101 and 102, and the separation portion 130 is arranged between the photodiodes 103 and 104. As described above, each of the separation portions 150, 120, and 140 optically and electrically separates an inner portion of a pixel, and each of the separation portions 110 and 130 optically and electrically separates one pixel from another. Similar to the separation portions 110 and 130, each of the separation portions 160 and 170 also separates one pixel from another. A dielectric film 300 can be a multilayer film including a silicon compound layer such as a silicon oxide layer or a silicon nitride layer and a metal oxide layer. The layers included in the dielectric film 300 function as an antireflection layer and a fixed charge layer. The layers included in the dielectric film 300 constitute the separation portions 110, 120, 130, 140, 150, 160, and 170.

Light shielding members 710 are arranged between the low refractive index layer 11 and the dielectric film 300. Each of the light shielding members 710 is arranged to overlap with each of the separation portions 110, 130, 160, and 170. Each of the light shielding members 710 is arranged not to overlap with each of the separation portions 120, 140, and 150. Light shielding walls 720 are arranged on the light shielding members 710. Similar to the light shielding walls 721 and 722 in FIG. 3A, each of the light shielding walls 720 is arranged between the lenses 201, 202, and 203. In the present exemplary embodiment, each of the light shielding walls 720 is arranged to penetrate through the silicon nitride layer 21 (extending portions 205 and 206) and is in contact with each of the light shielding members 710. Therefore, the light shielding walls 720 can be arranged to surround the intra-layer lenses 201, 202, and 203.

The power of the lenses 201, 202, and 203 has to be improved in order to collect and bring light incident on the lenses 201, 202, 203 into focus near the back surface 1001 positioned at a close distance from the lenses 201, 202, and 203. For example, a rough indication of "close distance" described above is a distance of 2 µm or less from each of the lenses 201, 202, and 203 to the back surface 1001. As described above, by arranging the silicon nitride layers 21 and 22 and the interlayer 23, power of the lenses 201, 202, and 203 can be improved by increasing the thickness thereof, while the stress in the lenses 201, 202, and 203 is reduced and deterioration of the optical characteristics is suppressed. Further, similar to the exemplary embodiment in FIGS. 5A and 5B, separation accuracy of light incident on two or more photodiodes can be improved by increasing the power of the lenses 201, 202, and 203.

In the examples illustrated in FIGS. 5A, 5B, and 6, a single lens array 200 including the silicon nitride layers 21 and 22 and the interlayer 23 is arranged. However, a plurality of lens arrays 200 including the silicon nitride layers 21 and 22 and the interlayers 23 may be stacked one on top of the other. By stacking the lens arrays 200 one on top of the other, an on-chip optical system having a shorter focal point distance can be provided.

Figure 7:
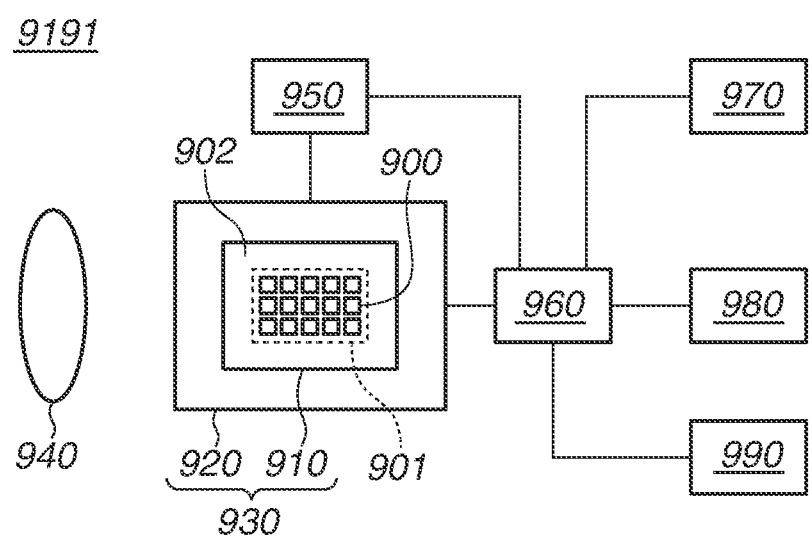
FIG. 7 is a schematic diagram illustrating an equipment.

FIG. 7 is a schematic diagram illustrating an equipment 9191 including the optical apparatus 930 serving as an imaging apparatus. In addition to the optical apparatus 930, the equipment 9191 further includes at least any one of an optical system 940, a control apparatus 950, a processing apparatus 960, a storage apparatus 970, a display apparatus 980, and a mechanical apparatus 990. The control apparatus 950 controls the optical apparatus 930. The processing apparatus 960 processes a signal output from the optical apparatus 930. The storage apparatus 970 stores information acquired by the optical apparatus 930. The display apparatus 980 displays information acquired by the optical apparatus 930. The mechanical apparatus 990 operates based on information acquired by the optical apparatus 930. The mechanical apparatus 990 may be a moving apparatus that moves the optical apparatus 930 within or together with the equipment 9191. An image stabilizer function can be realized by moving the optical apparatus 930 within the equipment 9191.

Although the optical apparatus 930 may include an electronic device 910 and a mounting member 920, the mounting member 920 does not have to be provided. The electronic device 910 is a semiconductor device having a semiconductor layer included in the base member 10 illustrated in FIG. 1A. The electronic device 910 includes a pixel area 901 on which pixels are arrayed and a peripheral area 902 on which a peripheral circuit (not illustrated) is arrayed. The lens array 200 according to the present exemplary embodiment can be arranged on the pixel area 901 of the equipment 9191. The above-described driving circuit, an analog-to-digital (AD) conversion circuit, a digital signal processing circuit, and a control circuit are included in the peripheral circuit. Although the pixel area 901 and the peripheral area 902 may be arranged on a same semiconductor layer, in the present exemplary embodiment, the pixel area 901 and the peripheral area 902 may be arranged on different semiconductor layers (semiconductor substrates) laminated with each other.

The mounting member 920 includes a ceramic package, a plastic package, a printed wiring board, a flexible cable, solder, and wire bonding. For example, the optical system 940 may be a lens, a shutter, a filter, or a mirror. The control apparatus 950 is a semiconductor device such as an application specific integrated circuit (ASIC). The processing apparatus 960 is a semiconductor device such as a central processing unit (CPU) or an ASIC which constitutes an analog frontend (AFE) or a digital frontend (DFE). For example, the display apparatus 980 is an electroluminescence display apparatus or a liquid crystal display apparatus. The storage apparatus 970 is a volatile memory such as a static random access memory (SRAM) or a dynamic RAM (DRAM), or a non-volatile memory such as a flash memory or a hard disk drive, e.g., a magnetic device or a semiconductor device. The mechanical apparatus 990 includes a movable unit or a driving unit such as a motor or an engine.

The equipment 9191 illustrated in FIG. 7 can be an electronic equipment such as an information terminal having an imaging function (e.g., a smartphone or a wearable terminal) or a camera (e.g., an interchangeable-lens camera, a compact camera, a video camera, or a monitoring camera). The mechanical apparatus 990 included in a camera can drive a component of the optical system 940 in order to execute zooming, focusing, or shutter operation. With respect to the interchangeable-lens camera, the present technique is favorable for a non-reflex type (i.e., mirrorless camera) rather than a reflex type (i.e., single-lens reflex camera). Because the non-reflex camera does not have a mirror, a flange focal distance to an image sensor (i.e., imaging apparatus) is shorter, and a back focal distance is also shorter. Therefore, in comparison to the reflex camera, the non-reflex camera needs an on-chip lens array having greater power. As described above, according to the technique discussed in the present specification, it is possible to provide a camera including a sensor having an on-chip lens array excellent in optical characteristics and capable of satisfying the above-described demand.

Further, the device 9191 can be a transportation device (moving body) such as a vehicle, a ship, an air vehicle, or an artificial satellite. The mechanical apparatus 990 included in a transportation device can be used as a moving apparatus. The device 9191 serving as a transportation device is preferable for transporting the optical apparatus 930 or assisting and automating an operation (driving operation) through an imaging function. The processing apparatus 960 for assisting and automating the operation (driving operation) can execute processing for operating the mechanical apparatus 990 serving as a moving apparatus based on the information acquired by the optical apparatus 930. Further, the device 9191 can be an analytical device or a medical device.

The optical apparatus 930 according to the present exemplary embodiment can provide high value to its designer, a manufacturer, a distributor, a purchaser, and a user. Therefore, value can be added to the equipment 9191 if the optical apparatus 930 is mounted on the equipment 9191. Therefore, when the equipment 9191 is to be manufactured and distributed, mounting the optical apparatus 930 of the present exemplary embodiment on the equipment 9191 is advantageous for adding value to the equipment 9191.

In FIGS. 5A, 5B, and 6, an imaging apparatus for generating an image has been described as an example of the optical apparatus 930. However, in addition to the imaging apparatus, a photometric apparatus, a light detection apparatus, a ranging apparatus, and a focus detection apparatus can be given as the examples of the optical apparatus 930 including a photodiode serving as a photoelectric conversion unit. Further, the optical apparatus 930 including a lens array may be a display apparatus. The lens array in the display apparatus collects light used for a display, so that image quality can be improved in terms of definition or light use efficiency. This display apparatus may be a self-luminous type display apparatus including an organic electroluminescence (EL) element, or may be a transmissive type or a reflection type display apparatus. The optical system 940 in the equipment 9191 is associated with the display apparatus 980 and projects an image displayed by the optical apparatus 930 to an exterior portion. The processing apparatus 960 in the equipment 9191 processes a signal input to the display apparatus 980.

As described above, the above-described exemplary embodiment can be changed as appropriate within a range which does not depart from the technical spirit of the present technique.

EFFECT OF THE PRESENT TECHNIQUE

According to an aspect of the present technique, it is possible to provide an optical apparatus including a plurality of lenses with improved optical characteristics.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-225866, filed Nov. 30, 2018, which is hereby incorporated by reference herein in its entirety.

What is claimed is:

1. An optical apparatus comprising:
a base member; and
a plurality of lenses arrayed on the base member,
wherein a curved surface constituting a convex surface or a concave surface of each of the plurality of lenses is defined by at least a first layer containing silicon and nitrogen and a second layer containing silicon and nitrogen,
wherein the first layer is positioned between the second layer and the base member,
wherein a third layer having a composition different from a composition of the first layer and a composition of the second layer is arranged between the first layer and the second layer,
wherein a thickness of the third layer is less than a thickness of the first layer and a thickness of the second layer, and
wherein the second layer is discontinued at portions between the plurality of lenses.

2. The optical apparatus according to claim 1,
wherein the thickness of the third layer is less than or equal to one-tenth the thickness of the first layer, and
wherein the thickness of the third layer is less than or equal to one-tenth the thickness of the second layer.

3. The optical apparatus according to claim 1, wherein the third layer contains silicon, nitrogen, and oxygen.

4. The optical apparatus according to claim 1, wherein an oxygen concentration of the third layer is higher than an oxygen concentration of the first layer and an oxygen concentration of the second layer.

5. The optical apparatus according to claim 1, wherein the thickness of the third layer is less than 20 nm.

6. The optical apparatus according to claim 1, wherein the thickness of the third layer is less than or equal to one-hundredth a sum of the thickness of the first layer and the thickness of the second layer.

7. The optical apparatus according to claim 1,
wherein the sum of the thickness of the first layer and the thickness of the second layer is 800 nm or more, and
wherein the thickness of the third layer is 5 nm or less.

8. The optical apparatus according to claim 1, wherein a distance between the first layer and the third layer and a distance between the second layer and the third layer are less than the thickness of the third layer.

9. The optical apparatus according to claim 1,
wherein each of the plurality of lenses has the convex surface on a side opposite to a side of the base member, and
wherein a thickness of the second layer is less than a thickness of the first layer.

10. The optical apparatus according to claim 1, wherein a height difference of the third layer from the base member is less than the thickness of the first layer and the thickness of the second layer.

11. The optical apparatus according to claim 1, wherein the first layer extends in a portion between the plurality of lenses and the base member.

12. The optical apparatus according to claim 1, wherein the third layer is discontinued at the portions between the plurality of lenses.

13. The optical apparatus according to claim 1, further comprising light shielding walls arranged between the plurality of lenses.

14. The optical apparatus according to claim 1, further comprising a fourth layer containing silicon, nitrogen, and oxygen, arranged along the convex surface.

15. The optical apparatus according to claim 14,
wherein a thickness of the fourth layer is greater than a thickness of the third layer, and
wherein the thickness of the fourth layer is less than a thickness of the first layer and a thickness of the second layer.

16. The optical apparatus according to claim 14, wherein an oxygen concentration of the fourth layer is higher than an oxygen concentration of the third layer.

17. The optical apparatus according to claim 1,
wherein the base member includes a semiconductor layer and a wiring structure,
wherein the wiring structure includes a wiring layer connected to a semiconductor element arranged on the semiconductor layer, and
wherein the semiconductor layer is positioned between the wiring structure and the plurality of lenses.

18. The optical apparatus according to claim 1,
wherein the base member includes a semiconductor layer on which a plurality of photodiodes are arranged, and
wherein two or more photodiodes from among the plurality of photodiodes correspond to one of the plurality of lenses.

19. The optical apparatus according to claim 1, further comprising a lens array arranged on a side opposite to a side of the base member with respect to the plurality of lenses.

20. An equipment comprising:
an optical apparatus which is an electronic device; and
at least any one of;
an optical system associated with the optical apparatus;
a control apparatus configured to control the optical apparatus;
a processing apparatus configured to process a signal output from the optical apparatus;
a display apparatus configured to display information acquired by the optical apparatus;
a storage apparatus configured to store information acquired by the optical apparatus; and
a mechanical apparatus configured to move the optical apparatus based on the information acquired by the optical apparatus,
wherein the optical apparatus comprises:
a base member; and
a plurality of lenses arrayed on the base member,
wherein a curved surface constituting a convex surface or a concave surface of each of the plurality of lenses is defined by at least a first layer containing silicon and nitrogen and a second layer containing silicon and nitrogen,
wherein the first layer is positioned between the second layer and the base member,
wherein a third layer having a composition different from a composition of the first layer and a composition of the second layer is arranged between the first layer and the second layer,
wherein a thickness of the third layer is less than a thickness of the first layer and a thickness of the second layer, and
wherein the second layer is discontinued at portions between the plurality of lenses.

* * * * *